United States Patent [19]

Ishii et al.

[11] Patent Number: 5,331,644
[45] Date of Patent: Jul. 19, 1994

[54] DECODER CHECKING CIRCUITS SUITABLE FOR SEMICONDUCTOR MEMORIES

[75] Inventors: Satoshi Ishii; Yuki Ushida, both of Tokyo, Japan

[73] Assignee: Oki Electric Industry Co., Ltd., Tokyo, Japan

[21] Appl. No.: 727,990

[22] Filed: Jul. 10, 1991

[30] Foreign Application Priority Data

Jul. 16, 1990 [JP] Japan .................................. 2-187624

[51] Int. Cl.$^5$ .......................................... G01R 31/28
[52] U.S. Cl. ...................................... 371/25.1; 371/27
[58] Field of Search .................. 371/25.1, 22.1, 15.1, 371/22.2, 22.5, 21.1, 51.1, 3, 21.3, 27.1; 365/189.07, 201; 364/265.3, 944.2

[56] References Cited

U.S. PATENT DOCUMENTS

| | | | |
|---|---|---|---|
| 4,295,219 | 10/1981 | Drapper et al. | 371/51 |
| 4,775,977 | 10/1988 | Dehara | 371/25.1 |
| 4,860,260 | 8/1989 | Saito et al. | 371/10 |
| 4,888,715 | 12/1989 | Tada et al. | 371/25.1 |
| 4,974,226 | 11/1990 | Fujimori et al. | 371/25.1 |
| 5,132,937 | 7/1992 | Tuda et al. | |
| 5,177,745 | 1/1993 | Rozman | 371/15.1 |
| 5,224,101 | 1/1993 | Popyack, Jr. | 371/15.1 |
| 5,271,015 | 12/1993 | Akiyama | 371/21.5 |

OTHER PUBLICATIONS

Jacob Millman et al. Microelectronics 1987 p. 276, p. 313, pp. 325-331.

Primary Examiner—Robert W. Beausoliel, Jr.
Assistant Examiner—Albert Decady
Attorney, Agent, or Firm—Edward D. Manzo

[57] ABSTRACT

A decoder checking circuit for testing a decoder in a semiconductor memory device, comprising an address signal generator for generating a test address signal, a first switch for transferring selectively either the address signal or the test address signal, to a decoder, a second switch for transferring the output of the decoder to the memory cell array, an expected value generator for generating an expected value for the output of the decoder, and a comparing circuit for comparing the output of the second switch with the expected value.

10 Claims, 6 Drawing Sheets

INITIALIZATION

DECODER CHECKING CIRCUITS SUITABLE FOR SEMICONDUCTOR MEMORIES

REFERENCE TO THE RELATED APPLICATION

This invention claims the right of priority under 35 U.S.C. 119, of the Japanese Patent Application Serial No. 02-187624, filed on Jul. 16, 1990.

BACKGROUND OF INVENTION

1. Field of the Invention

The present invention relates to a decoder checking circuit for checking a decoder used for a semiconductor memory such as a static Random Access Memory (SRAM), a dynamic RAM (DRAM) or the like.

2. Description of the Related Art

Circuit testing has been very important together with the increased density of semiconductor memories such as dynamic RAMs in order to ensure the good reliability. Various proposals have been offered to simplify the testing system. A semiconductor memory testing technology was disclosed in the paper entitled, "Incorporated Self-Test Memory (1) - Applications To DRAM", written by Takada and Shimada et al, pages 5-327, in the 1989 Spring Domestic Meeting of Electron Data Communication Society.

FIG. 2 is a block diagram illustrating an arrangement of conventional self-test type dynamic RAM.

In FIG. 2, a memory cell array 1 has a plurality of memory cells. The memory cell array 1 also is connected to a column decoder 2 for decoding an address signal AD to select memory cells associated with a column line, and a row decoder 3 for selecting memory cells associated with a row line. Further, the memory cell array 1 is connected to the column decoder 2, the row decoder 3, the input/output bus 4.

Such a conventional RAM device has also a self-test function constituted by a micro read-only memory (ROM) 10, a test control circuit 11 for switching selectively to a normal memory operation mode and a self-test mode in response to a switching signal TE, and a pattern comparing circuit 12.

The micro ROM 10 stores a test pattern generating and comparing program for carrying out a marching test and a checker board test in a form of a microcode.

This dynamic RAM switches its operation mode between the normal memory operation mode and the self-test mode in response to the switching signal TE. In the normal memory operation mode, the address signal AD is decoded by the column decoder 2 and the row decoder 3. Memory cells in the memory cell array 1 are selected in accordance with the result of the decoding, whereby data are written into and read from the selected memory cells through the input/output bus 4.

In a memory self-test mode, after the self-test function is initialized in accordance with a test pattern stored in the micro ROM 10, date are written in the memory cells of the memory cell array 1. Then the data thus written are read and compared with an expected value by the pattern comparing circuit 12. The test result representing coincidence or non-coincidence is outputted. With the result of this test, it is possible to test whether the operating condition of the entire dynamic RAM including the column decoder 2, the row decoder 3 and the memory cell array 1 is normal or abnormal.

However, the above-mentioned conventional self-test type dynamic RAM has given the following problems:

In the conventional self-test system, the test pattern generating and comparing program is stored in the micro ROM 10 in a form of a micro code, and the quality of the entire dynamic RAM is determined in accordance with the test pattern.

In order to improve the reliability of the dynamic RAM, it is required to test the quality of each of circuits in the dynamic RAM and to analyze the operational condition of each circuit. Particularly, in a semiconductor memory, it is required to individually check the memory cell array 1, the column and row decoders 2, 3 which are a main portion of the semiconductor memory. It is relatively convenient to check the quality of the memory cell array 1.

However, in order to test the column decoder 2 and the row decoder 3, a specific bit pattern has to be mapped on a memory plane, as in a marching test or a checker board test. Accordingly, a large test pattern is required. Further, the performance of this test pattern for testing the column decoder 2 and the row decoder 3 requires a very long period of test time. Therefore, it has been difficult to solve easily such a problem on the decoder testing.

SUMMARY OF THE INVENTION

It is an object of the invention to provide a decoder checking circuit suitable for a semiconductor memory which can work with smaller and shorter test patterns for testing a decoder.

It is another object of the invention to provide a decoder checking circuit semiconductor memory which can provide a short time test procedure for a decoder.

A decoder checking circuit for semiconductor memory according to the present invention comprises a memory cell array in which a plurality of memory cells are arranged in a matrix form, a decoder for decoding an address signal so that the memory cells are accessed in accordance with an output from the decoder, and an improved decoder checking circuit. The decoder checking circuit comprises an address signal generator for generating a test address signal; a first switching means for transferring from the address signal to the test address signal in accordance with a switching signal to deliver the test address signal to the decoder; a second switching means for switching the output from the decoder in accordance with the test address signal, from the memory address side in response to the switching signal; an expected value generator for generating an expected value for the output from the decoder in accordance with the test address signal; and a comparing circuit for comparing the output from the decoder which has been switched by the second switching means.

Furthermore, according to a present invention, a decoder checking circuit comprising: an address signal generator for generating a test address signal; a first switching means having a first input connected to the address signal, a second input connected to an address signal, and an output, for connecting selectively the output to either the first input or the second input; a decoder having an input connected to the output of said first switching means and an output; a second switching means having an input connected to the output of said decoder, a first output and a second output, for connecting selectively the input to either the first output or the second output; an expected value generator for generating an expected value; and a comparing circuit for comparing a signal outputted from the first output of said second switching means and the expected value.

A semiconductor memory with a decoder checking circuit comprising: a memory cell array having a plurality of memory cells; an address signal generator for generating a test address signal; a first switching means having a first input connected to the address signal, a second input connected to the test address signal, and an output, for connecting selectively the output to either the first input and the second input; a decoder having an input connected to the output of said first switch means and an output; a second switching means having an input connected to the output of said decoder, a first output connected to said memory cell array, and a second output, for connecting selectively the input to either the first output or the second output; an expected value generator for generating an expected value; and a comparing circuit for comparing a signal outputted from the first output of said second switching means with an expected value.

According to the present invention, since the semiconductor memory decoder checking circuit is constructed as mentioned above, when the first and second switching means are switched to set the test mode, the address signal generator delivers a test address signal which is then delivered to the decoder through the first switching means. Then, the decoder decodes this test address signal, and transmits the result of the decoding to the comparing circuit through the second switching means.

Meanwhile, the expected value generator generates an expected value which corresponds to the output of the decoder based upon the above-mentioned test address signal, and delivers the same to the comparing circuit. The comparing circuit compares a decoder output transmitted from the second switching means with the expected value delivered from the expected value generator, and delivers a signal corresponding to the result of the comparison.

Accordingly, no long test pattern is required for checking the decoders. Accordingly, it is possible to conveniently check whether the decoders are satisfactory or not. Thus, the above-mentioned conventional problems can be solved.

The further scope and applicability of the present invention will become apparent from the detailed description and specific example, while indicated preferred embodiments of the invention are given by way of illustration only, since various changes and modifications within the spirit and scope of the invention will become apparent to those skilled in the art from this detailed description.

BRIEF DESCRIPTION OF THE DRAWINGS

These and other features and advantages of the invention may be more completely understood from the following detailed description of the preferred embodiments of the invention with reference to the accompanying drawings in which.

DETAILED DESCRIPTION OF THE PREFERRED EMBODIMENTS

Figure 1:
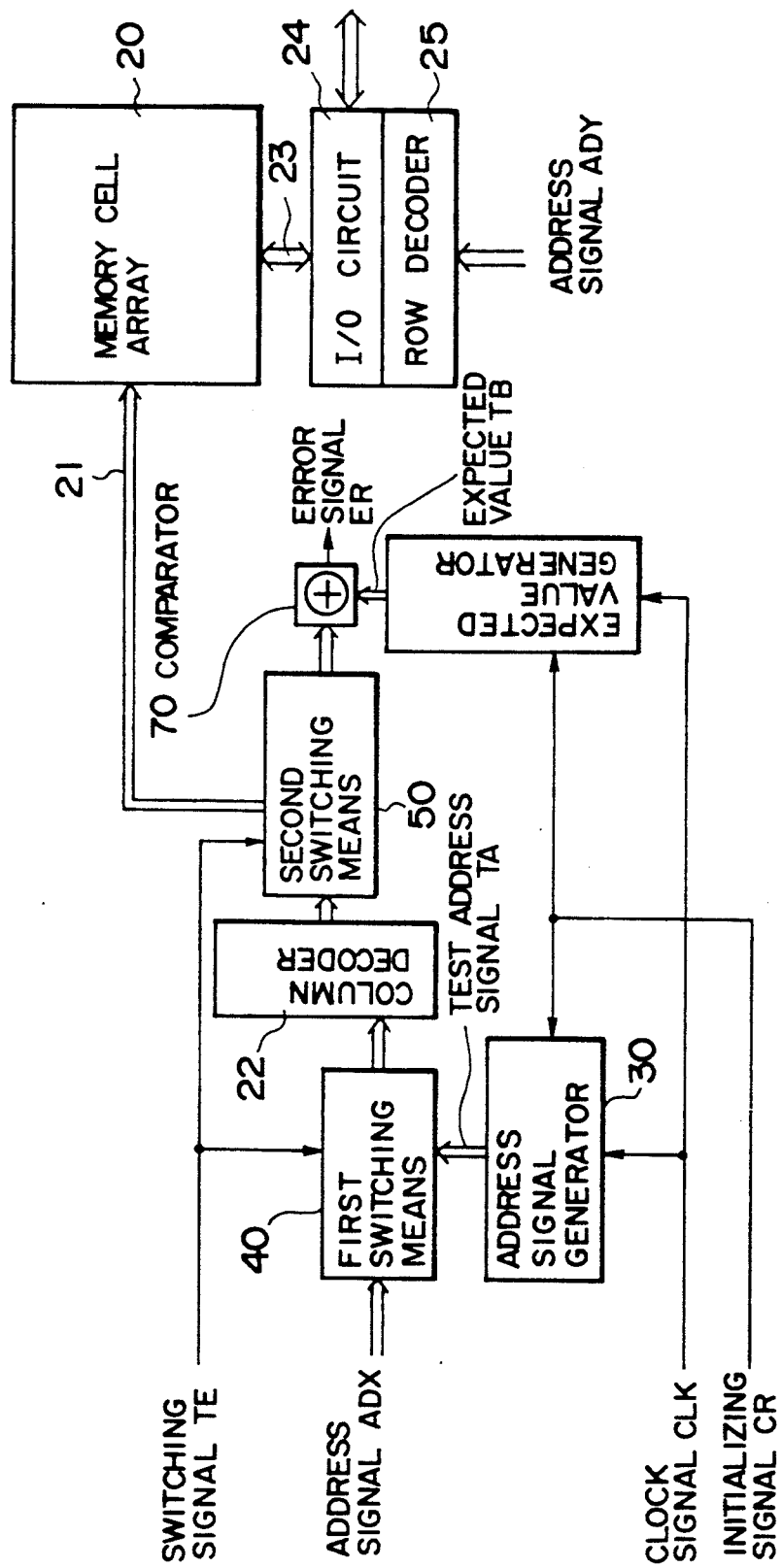
FIG. 1 is a block diagram illustrating a semiconductor memory device including a decoder checking circuit according to an embodiment of the present invention.
Figure 2:
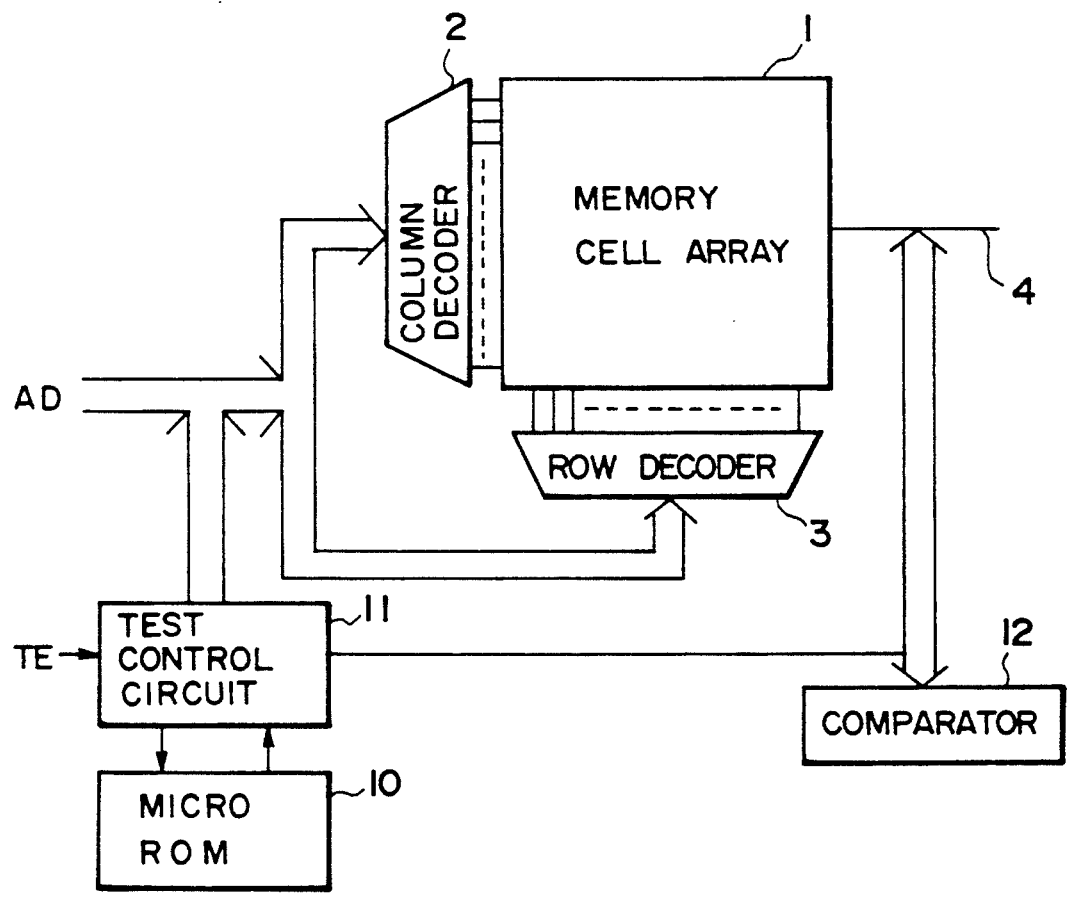
FIG. 2 is a block diagram illustrating a conventional self-test type dynamic RAM device.

An embodiment of the present invention is shown in FIG. 1 which is a block diagram illustrating the arrangement of a decoder checking circuit of a semiconductor memory.

The decoder checking circuit, for example, is incorporated in a conventional dynamic RAM circuit. That is, the dynamic RAM includes a memory cell array 20 in which several memory cells are arranged in a matrix-form pattern. Memory cells associated with a column lines in this memory cell array are selected through word lines 21 in accordance with the selection signal produced by a column decoder 22 which decodes an address signal ADX. The memory cell array 20 is connected to an input-output circuit 24 for inputting and outputting data and to a row decoder 25 for decoding an address signal ADY to select memory cells associated with a row line of the memory cell array 20 through bit lines 23.

A decoder checking circuit provided for a conventional dynamic RAM has an address signal generator 30, a first switching means 40 composed of a selector, a second switching means 50 composed of switches and gate circuits, an expected value generator 60 composed of a shift register, and a comparing circuit 70.

The address signal generator 30 is a circuit which is initialized by an initializing signal CR and which delivers a test address signal TA in accordance with a clock signal CLK, its output side being connected to the first switching means 40. The first switching means 40 is a circuit for selecting either the address signal ADX or the test address signal TA in accordance with a switching signal TE, its output side being connected to the column decoder 22.

The second switching means 50 is connected to the output of the column decoder 22, and switches the output of the column decoder 22 to either the word line 21 or the comparing circuit 70, in accordance with the switching signal TE, its output side being connected to the comparing circuit 70. The expected value generator 60 is initialized by the initializing signal CR and generates an expected value of the output of the column decoder 22 in accordance with the test address signal TA in response to the clock signal CLK, its output side being connected to the comparing circuit 70. The comparing circuit 70 compares an output from the second switching means 50 with the expected value TB, and delivers an error signal ER in accordance with the result of the comparison.

Figure 3:
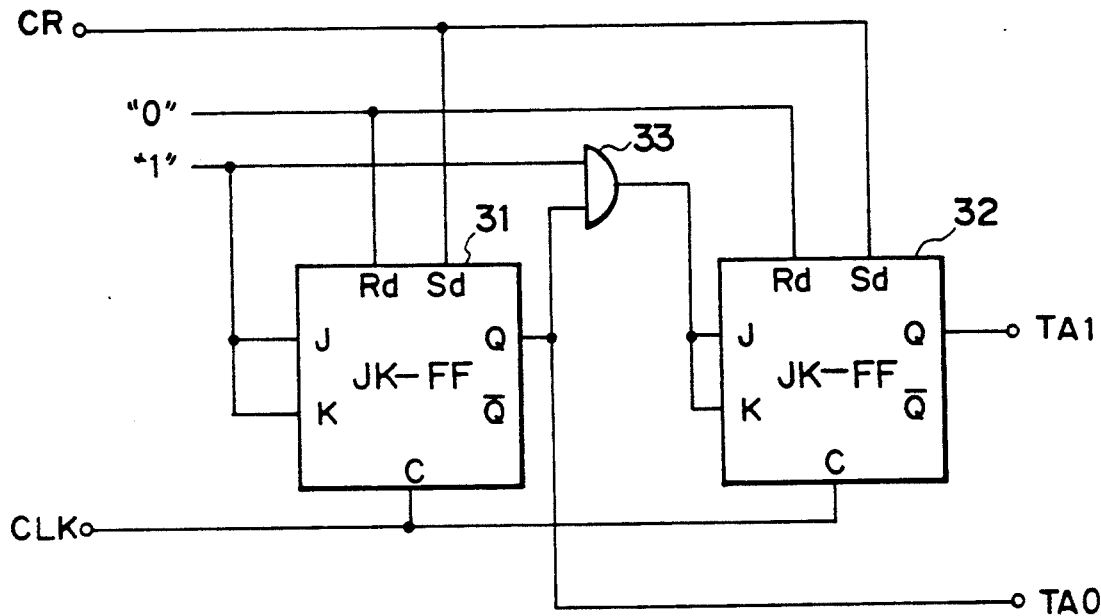
FIG. 3 is a block diagram illustrating a signal generator shown in FIG. 1.

FIG. 3 is a block diagram showing an example of the address signal generator 30 shown in FIG. 1.

The address signal generator 30 is composed of a two-bit binary counter comprising JK-type flip-flops (denoted hereinbelow as "JK-FF") 31 and 32, and an AND gate 33.

The JK-FFs 31, 32 change their outputs Q into "H" level K when a control input J is at "H" level while a control input is at "L" level. On the contrary, the outputs Q are turned into "L" level when the control input J is at "L" level while the control input K is at "H" level. When both control inputs J, K are at "L" level, the condition of the outputs Q is not changed. Further, when both control inputs J, K are at "H" level, the level of the outputs Q is inverted.

The control inputs J, K of the JK-FF 31 are fixed to "1" and a direct reset RD is fixed to "0" while a direct reset Sd is connected to the initializing signal CR. The control inputs J, K of the JK-FF 32 are connected to the output of the AND gate 33 while the direct reset RD is fixed to "0". The direct reset Sd is connected to the initializing signal CR. Accordingly, the JK-FF 31, 32 are synchronized with the clock signal CLK so as to deliver test address signals TA0, TA1 at their outputs Q, respectively.

Figure 4:
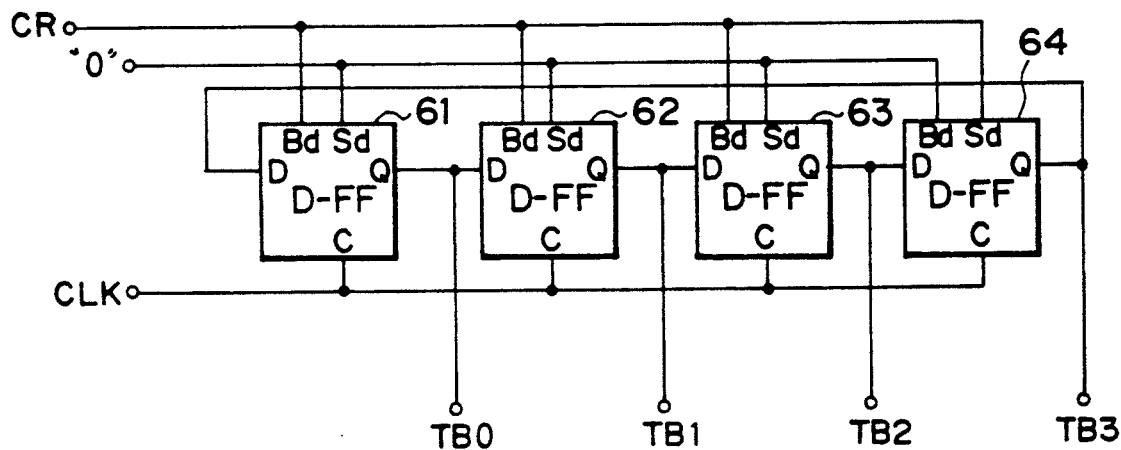
FIG. 4 is a block diagram illustrating an expected value generator shown in FIG. 1.

FIG. 4 shows an example of the arrangement of the expected value generator 6 shown in FIG. 1.

The expected value generator 60 is composed of a shift register comprising four stages delay type flip-flops (denoted hereinbelow as "D-FF") 61 to 64. At each of the D-FFs 61 to 64, the level of an input D is that of the output Q until the next clock signal CLK comes. Accordingly, each of the D-FFs 61 to 64 outputs four bit expected values TB0 to TB3 at their outputs Q, respectively.

Figure 5:
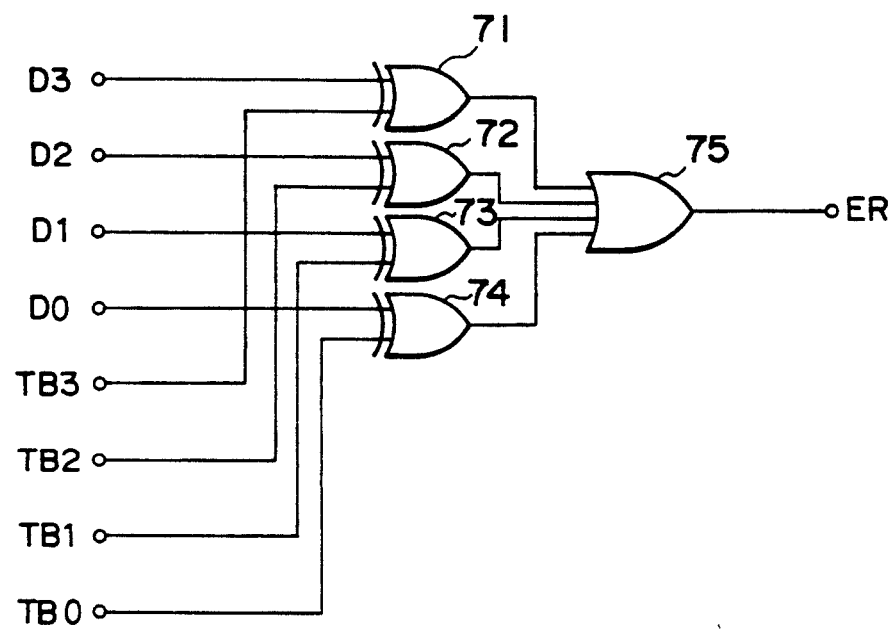
FIG. 5 is a block diagram illustrating a comparing circuit shown in FIG. 1.

FIG. 5 shows an example of the arrangement of the comparing circuit 70 shown in FIG. 1.

The comparing circuit 70 is composed of four exclusive logic OR gates (denoted as "Ex-OR gate") 71 to 74 and an OR gate 75. The comparing circuit 70 compares outputs D0 to D3 of the column decoder 22 with the expected values TB0 to TB1, respectively, i.e., one bit by one bit, so as to deliver an error signal ER as a result of the comparison.

Next, an explanation will be made hereinbelow of the normal memory operation mode (1) and the test operation mode (2).

(1) Normal Memory Operation Mode

In the normal memory operation mode, the first switching means 40 selects the address signal ADX in response to the switching signal TE, and the second switching means 50 delivers the output of the column decoder 22 to the memory cell array 20.

In the case of reading data in the memory cell array 20, the address signal ADX is delivered to the column decoder 22 through the first switching means 40 while the address signal ADY is delivered to the row decoder 25. Then, the column decoder 22 decodes the address signal ADX, and delivers the result of the decoding to the memory cell array 20 through the second switching means 50 and the word lines 21 so as to select memory cells arranged in a column-wise direction within the memory cell array 20.

Data in the selected memory cells arranged in the column-wise direction are read onto the bit lines 23, and data in memory cells in a row-wise direction are selected in accordance with a result of decoding by the row decoder 25 for decoding the address signal ADY. The data thus selected is read out through the input-/output circuit 24.

(2) Test Operation Mode

Figure 6A:
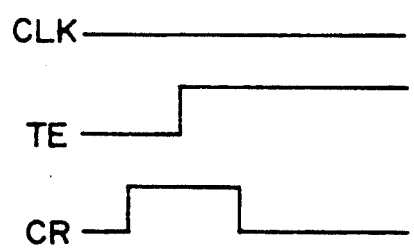
FIG. 6A to 6C are views illustrating operational waveforms generated during a test mode.
Figure 6B:
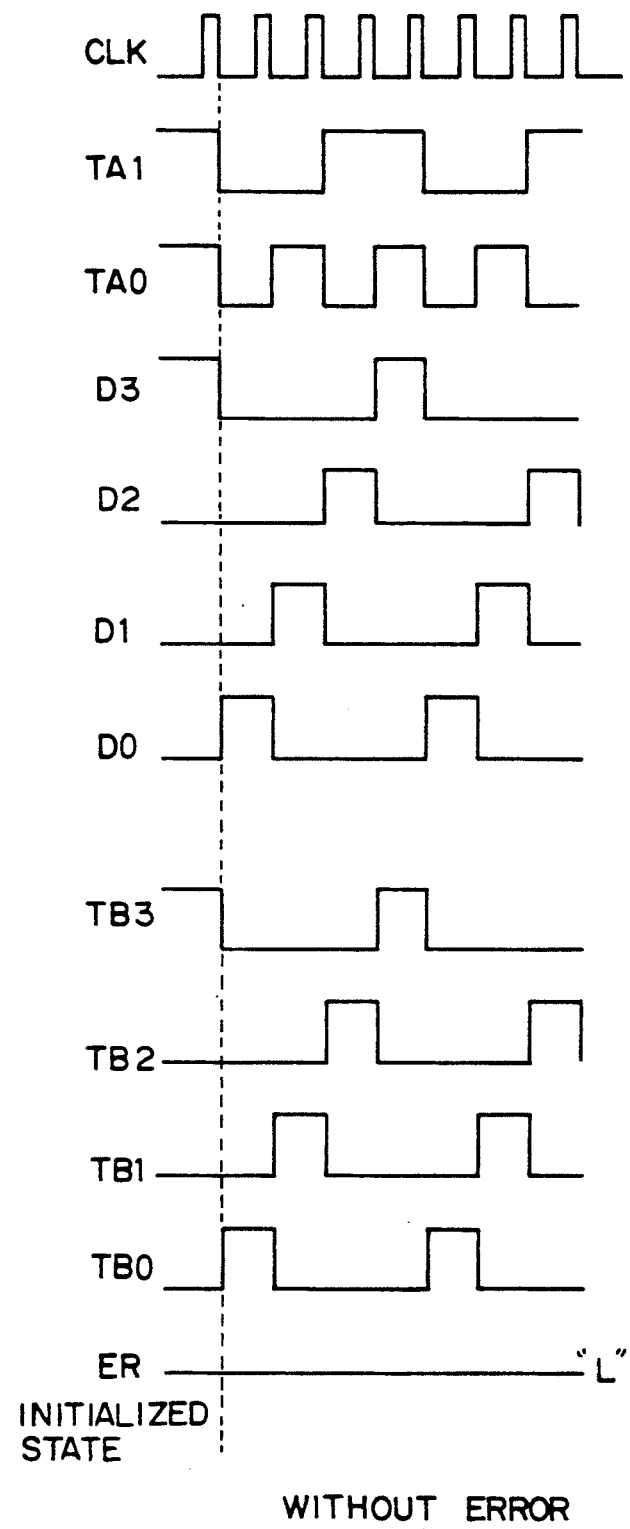
Figure 6C:
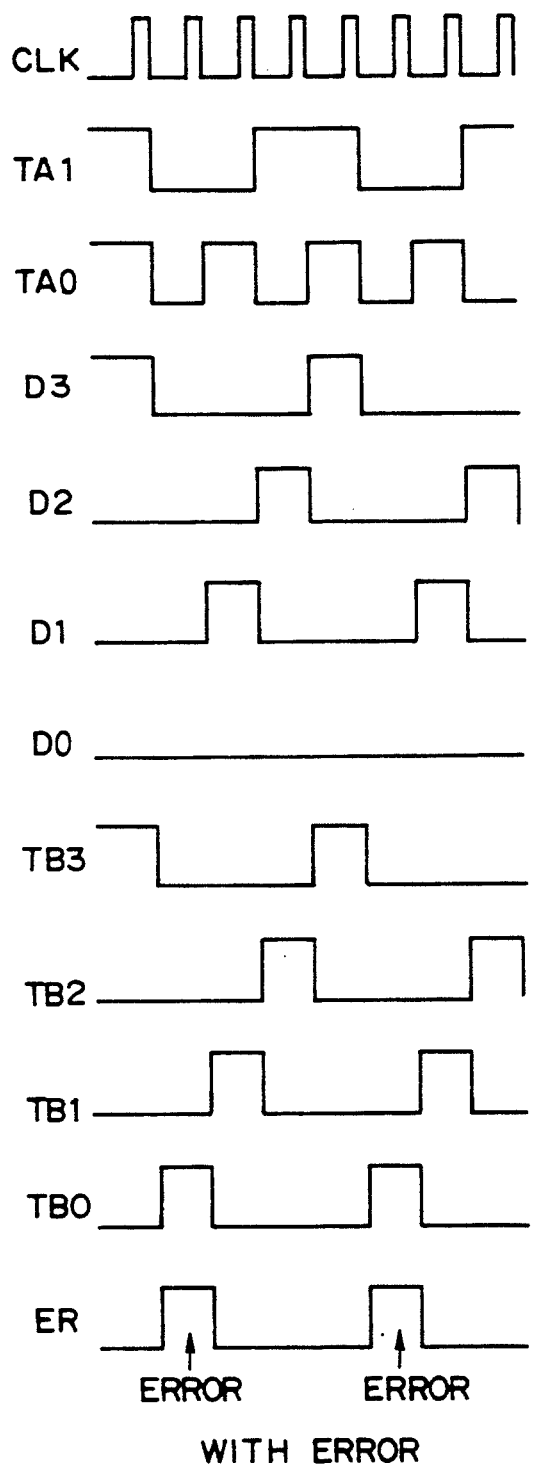

FIGS. 6A to 6C shows operating waveforms in a test operation mode shown in FIG. 1. FIG. 6A shows a waveform at the time of the initialization, FIG. 6B shows a waveform having no error, and FIG. 6C shows a waveform having an error.

In the test operation mode, the first switching means 40 selects a test address signal TA generated by the address signal generator 30 in response to the switching signal TE, and the second switching means 50 delivers the output of the column decoder 22 to the comparing circuit 70.

For example, a case in which the column decoder 22 receives two bit test address signals TA0, TA1 and delivers four bit outputs D0 to D3, such as shown in Table 1, will be explained.

TABLE 1

| COLUMN DECODER TRUTH VALUE | | | | | |
|---|---|---|---|---|---|
| INPUT | | OUTPUT | | | |
| TA0 | TA1 | D3 | D2 | D1 | D0 |
| 0 | 0 | 0 | 0 | 0 | 1 |
| 0 | 1 | 0 | 0 | 1 | 0 |
| 1 | 0 | 0 | 1 | 0 | 0 |
| 1 | 1 | 1 | 0 | 0 | 0 |

First, as shown in FIG. 6A, when the clock signal CLK shown in FIG. 1 is set to "L" level while the initializing signal CR is at "H" level, the address signal generator 30 and the expected value generator 60 are initialized. Accordingly, the decoder checking circuit is initialized as shown in FIG. 6B.

Next, the switching signal TE is changed from "L" level to "H" level as shown in FIG. 6A so as to change over the first and second switching means 40, 50 to set the test operation mode. When the clock signal CLK is delivered to the address signal generator 30 and the expected value generator 60, as shown in FIG. 6B, the address signal generator 30 produces test address signals TA0, TA1, and the expected value generator 60 produces expected values TB0 to TB3. The address signals TA0, TA1 are then delivered from the address signal generator 30 to the column decoder 22 through the first switching means 40.

The line decoder 22 decodes the test address signals TA0, TA1 as shown in the truth value table 1, and delivers its outputs D0 to D3, as a result of the decoding, to the comparing circuit 70 through the second switching means 50. The comparing circuit 70 compares the outputs D0 to D3 delivered from the column decoder 22 with the expected values TB1 to TB3 delivered from the expected value generator 60. In the case of normal operation of the column decoder 22, the outputs D0 to D3 of the column decoder 22 are coincided with the expected values TB0 to TB3, as shown in FIG. 6B. Accordingly, an error signal ER delivered from the comparing circuit 70 is at "L" level.

Next, in a case in which the column decoder 22 fails so that the output D0 of the column decoder 22 is fixed to a low level, the output D0 of the column decoder 22 and the expected value TB0 are not coincided with each other, as shown in FIG. 6C. Accordingly, the comparing circuit 70 outputs the error signal ER of "H" level.

Thus, the decoder checking circuit in this embodiment can easily determine whether the column decoder 22 is failed or not in a short time only by checking the error signal ER delivered from the comparing circuit 70 without using a long test pattern.

It is noted that the present invention should not be limited to the above-mentioned embodiment, but various changes and modification may be made thereto. Examples of these changes are as follows:

In the above-mentioned embodiment, explanation has been made of the checking of the decoder having two bit inputs and four bits outputs. However, the number of bits of the column decoder 22 can be set to an arbitrary value in accordance with the scale of the memory cell array.

In the above-mentioned embodiment, it has been explained that the address transition signal produced by the address signal generator 30 is sequential. However, the address transition signal may be an address compliment signal. The circuit arrangement of the expected value generator 60 can be changed in consideration with the case.

Although it has been explained in the above-mentioned embodiment that the column decoder 22 is checked, the row decoder can be also checked with the use of the decoder checking circuit shown in FIG. 1.

Further, the decoder checking circuit in the above-mentioned embodiment can be applied for checking decoders in other semiconductor memories such as static RAMs or ROMs other than dynamic RAMs.

As mentioned above, according to the present invention, the operation mode is switched to the test operation mode with the use of the first and second switching means so as to deliver a test address signal generated from the address signal generator to the decoder, and an output from the decoder is compared with an expected value generated from the expected value generator by the comparing circuit. Accordingly, it is possible to easily determine whether the decoder is failed or not in a short time without using a long test pattern which has been essential in conventional decoder tests. Accordingly, in the function of a decoder in a large scale integrated semiconductor memory device, the test time can be shorten and to facilitate the test procedure can be facilitated, whereby it is possible to enhance the reliability of the semiconductor memory.

What we claim is:

1. A semiconductor memory with a decoder checking circuit comprising:
   a memory cell array having a plurality of memory cells;
   an address signal generator for generating a test address signal;
   a first switching means having a first input receiving an address signal, a second input receiving the test address signal, and an output, for connecting selectively the output to either the first input or the second input in response to a switching signal;
   a decoder having an input connected to the output of said first switch means and an output;
   a second switching means having an input connected to the output of said decoder, a first output connected to said memory cell array, and a second output, for connecting selectively the input to either the first output or the second output in response to the switching signal;
   an expected value generator for generating an expected value signal; and
   a comparing circuit for comparing a signal outputted from the first output of said second switching means with the expected value signal and outputting an error signal in accordance with the result of the comparison.

2. A semiconductor memory as set forth in claim 1, wherein said address signal generator generates the test address signal in accordance with a clock signal.

3. A semiconductor memory as set forth in claim 1, wherein said expected value generator generates the expected value in accordance with a clock signal.

4. A semiconductor memory as set forth in claim 1, wherein said address signal generator and expected value generator are initialized by an initializing signal.

5. A semiconductor memory as set forth in claim 1, wherein said address generator has a plurality of flip-flops and an AND gate.

6. A semiconductor memory as set forth in claim 5, wherein the flip-flop is a JK-type flip-flop.

7. A semiconductor memory as set forth in claim 1, wherein said expected value generator has a plurality of flip-flops.

8. A semiconductor memory as set forth in claim 6, wherein the flip-flop is a delay type flip-flop.

9. A semiconductor memory as set forth in claim 1, wherein said comparing circuit has a plurality of exclusive OR gates and an OR gate.

10. A semiconductor memory with a decoder checking circuit comprising:
   a memory cell array having a plurality of memory cells;
   an address signal generator for generating a test address signal;
   a first switching means having a first input receiving an address signal, a second input receiving the test address signal, and an output, for connecting selectively the output to either the first input or the second input in response to a switching signal;
   a decoder having an input connected to the output of said first switch means and an output;
   a second switching means having an input connected to the output of said decoder, a first output connected to said memory cell array, and a second output, for connecting selectively the input to either the first output or the second output in response to the switching signal;
   an expected value generator for generating an expected value signal; and
   a comparing circuit for comparing a signal outputted from the decoder with the expected value signal outputted from the expected value generator, and outputting an error signal in accordance with the result of the comparison.

* * * * *